United States Patent
Kim et al.

(10) Patent No.: US 9,082,668 B2
(45) Date of Patent: Jul. 14, 2015

(54) DISPLAY PANEL AND METHOD OF MANUFACTURING THE SAME

(71) Applicant: Samsung Display Co., Ltd., Yongin (KR)

(72) Inventors: Young-Do Kim, Cheonan-si (KR); Jung-Moo Hong, Seoul (KR); In-Seo Kee, Seongnam-si (KR); Young-Kuil Joo, Asan-si (KR); Suk Choi, Seongnam-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/159,114

(22) Filed: Jan. 20, 2014

(65) Prior Publication Data

US 2015/0041813 A1    Feb. 12, 2015

(30) Foreign Application Priority Data

Aug. 7, 2013    (KR) .................. 10-2013-0093599

(51) Int. Cl.
*H01L 27/12*    (2006.01)
*H01L 27/15*    (2006.01)

(52) U.S. Cl.
CPC .......... *H01L 27/124* (2013.01); *H01L 27/1222* (2013.01); *H01L 27/1262* (2013.01); *H01L 27/156* (2013.01)

(58) Field of Classification Search
CPC .. H01L 27/124; H01L 27/1262; H01L 27/156

USPC ..................................................... 257/59, 262
See application file for complete search history.

(56) References Cited

U.S. PATENT DOCUMENTS

| | | | |
|---|---|---|---|
| 6,552,488 B1 | 4/2003 | Roitman et al. | |
| 6,897,087 B2 | 5/2005 | Yanagawa et al. | |
| 8,106,583 B2 | 1/2012 | Shin et al. | |
| 2006/0214576 A1 | 9/2006 | Takahashi et al. | |
| 2007/0024783 A1* | 2/2007 | Joo | 349/123 |
| 2012/0161141 A1 | 6/2012 | Jeon et al. | |

FOREIGN PATENT DOCUMENTS

| | | |
|---|---|---|
| JP | 2004-349107 | 12/2004 |
| JP | 2006-339028 | 12/2006 |
| JP | 2013-020744 | 1/2013 |
| KR | 10-2007-0019147 | 2/2007 |
| KR | 10-2012-0039874 | 4/2012 |

* cited by examiner

*Primary Examiner* — Cathy N Lam
(74) *Attorney, Agent, or Firm* — H.C. Park & Associates, PLC

(57) ABSTRACT

A display panel including a first switching element, a first pixel electrode electrically connected to the first switching element, the first pixel electrode including a reflective material. A first light emitting layer is disposed on the first pixel electrode, and emits light having a first color when a voltage is applied to the first pixel electrode. A thin encapsulation film is disposed on the first light emitting layer, and protects the first light emitting layer. A pressure sensitive adhesive layer is disposed on the thin encapsulation film, and a first color filter is disposed on the pressure sensitive adhesive layer, corresponding to the first light emitting layer, and has the first color.

12 Claims, 15 Drawing Sheets

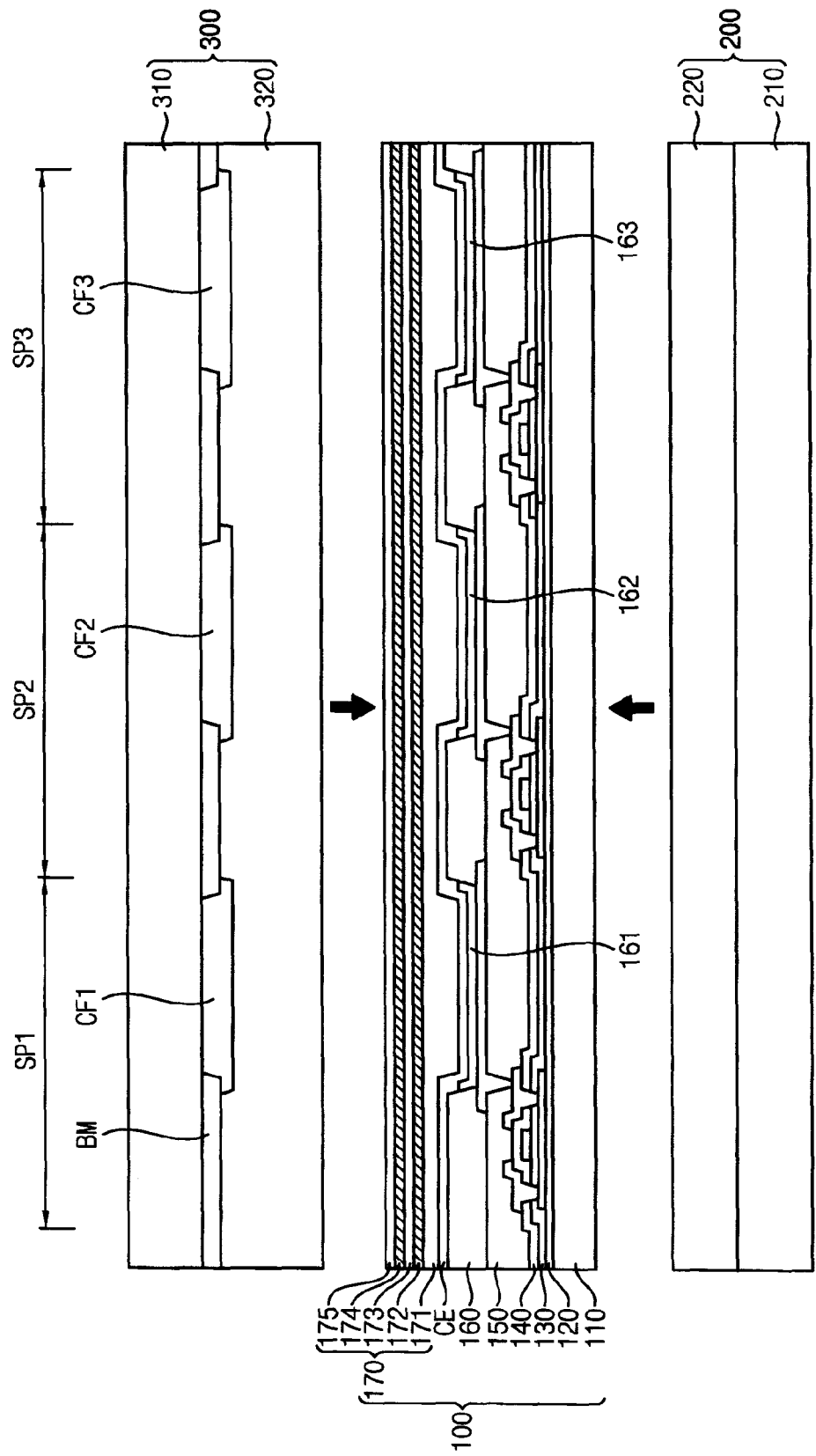

DISPLAY PANEL AND METHOD OF MANUFACTURING THE SAME

CROSS-REFERENCE TO RELATED APPLICATION

This application claims priority from and the benefit of Korean Patent Application No. 10-2013-0093599, filed on Aug. 7, 2013, which is hereby incorporated by reference for all purposes as if fully set forth herein.

BACKGROUND

1. Field

Exemplary embodiments of the present invention relate to a display panel and a method of manufacturing the display panel. More particularly, exemplary embodiments of the present invention relate to a display panel for an organic light emitting diode (OLED) display apparatus and a method of manufacturing the display panel.

2. Discussion of the Background

A liquid display apparatus having light weight and small size has recently been manufactured. A cathode ray tube (CRT) display apparatus has been used for many years because of its good performance and its competitive price. However, the CRT display apparatus has disadvantages in its relatively large size, high weight, and lack of portability. Therefore, the liquid display apparatus has recently been in high demand because of its relatively small size, light weight and low-power-consumption.

An organic light emitting display apparatus generally includes organic light emitting layers emitting red, green, and blue light, and pixel electrodes, so that the organic light emitting display apparatus may display various colors. The pixel electrode of the organic light emitting display apparatus is a reflective electrode for reflecting light. However, the pixel electrode also reflects external light, so that visibility of the organic light emitting display apparatus may be reduced.

The above information disclosed in this Background section is only for enhancement of understanding of the background of the invention and, therefore, it may contain information that does not constitute prior art.

SUMMARY

Exemplary embodiments of the present invention provide a display panel capable of improving a visibility of the display panel by decreasing reflectance of external light.

Exemplary embodiments of the invention also provide a method of manufacturing the display panel.

Additional features of the invention will be set forth in the description which follows, and in part will become apparent from the description, or may be learned from practice of the invention.

An exemplary embodiment of the present invention discloses a display panel including a first switching element, a first pixel electrode electrically connected to the first switching element, the first pixel electrode including a reflective material. A first light emitting layer is disposed on the first pixel electrode, and emits light having a first color when a voltage is applied to the first pixel electrode. A thin encapsulation film is disposed on the first light emitting layer, and protects the first light emitting layer. A pressure sensitive adhesive layer is disposed on the thin encapsulation film, and a first color filter is disposed on the pressure sensitive adhesive layer. The first color filter corresponds to the first light emitting layer and has the first color.

An exemplary embodiment of the present invention also discloses a method of manufacturing a display panel including forming a display substrate, forming an upper protecting film comprising forming a first color filter having the first color on a base layer, and forming a pressure sensitive adhesive layer on the first color filter, and attaching the pressure sensitive adhesive layer of the upper protecting film onto a thin encapsulation film of the display substrate. The display substrate includes a first switching element, a first pixel electrode electrically connected to the first pixel electrode and comprising a reflective material, a first light emitting layer disposed on the first pixel electrode and emitting light having a first color when a voltage is applied to the first pixel electrode, and the thin encapsulation film disposed on the first light emitting layer and protecting the first light emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 8 is a cross-sectional view illustrating a step of attaching an upper protecting film and a lower protecting film to a display substrate for manufacturing a display panel.

DETAILED DESCRIPTION OF THE ILLUSTRATED EMBODIMENTS

Figure 1:
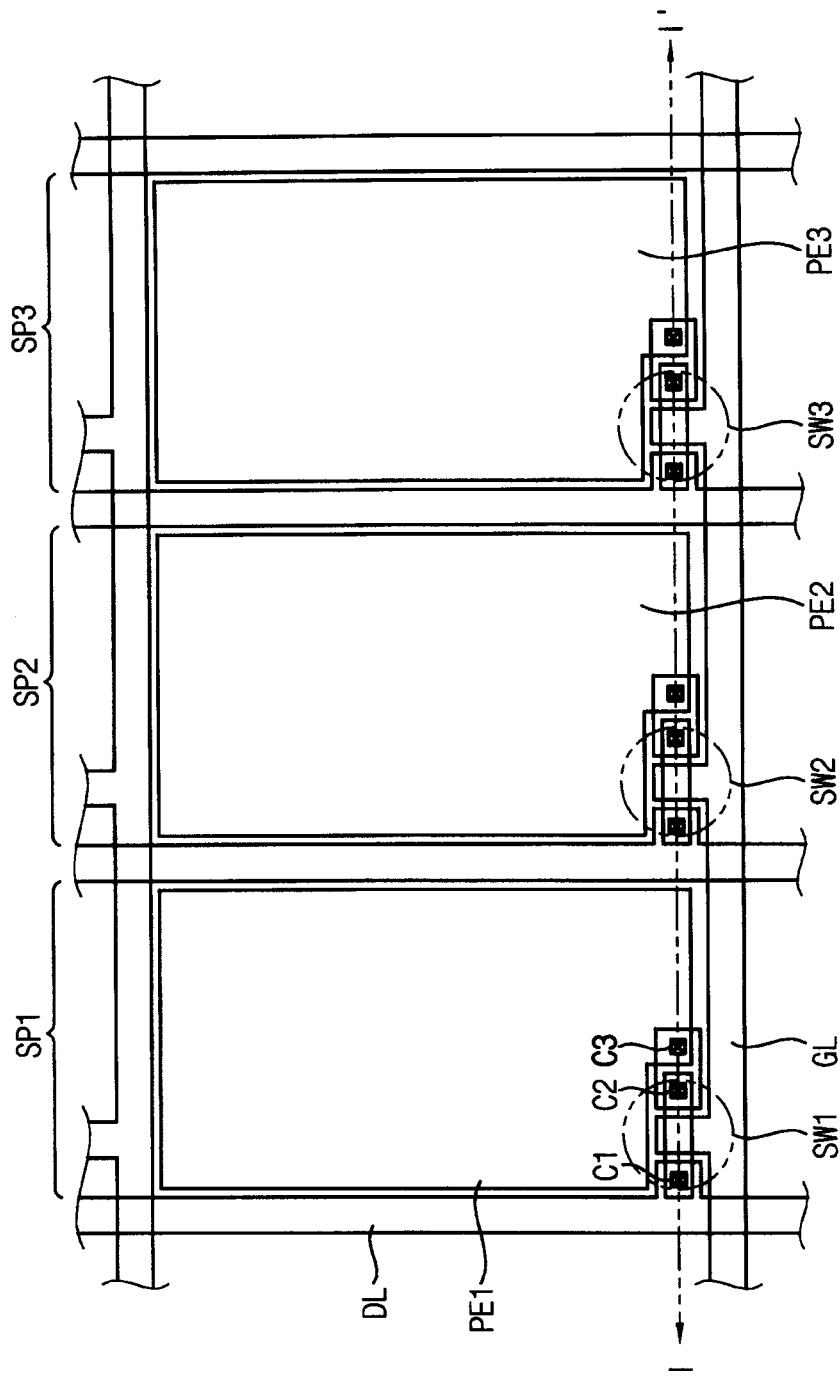
FIG. 1 is a plan view illustrating a display panel according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

It will be understood that when an element or layer is referred to as being "on", "connected to", or "coupled to" another element or layer, it can be directly on, connected to, or coupled to the other element or layer, or intervening elements or layers may be present. In contrast, when an element is referred to as being "directly on," "directly connected to", or "directly coupled to" another element or layer, there are no intervening elements or layers present. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
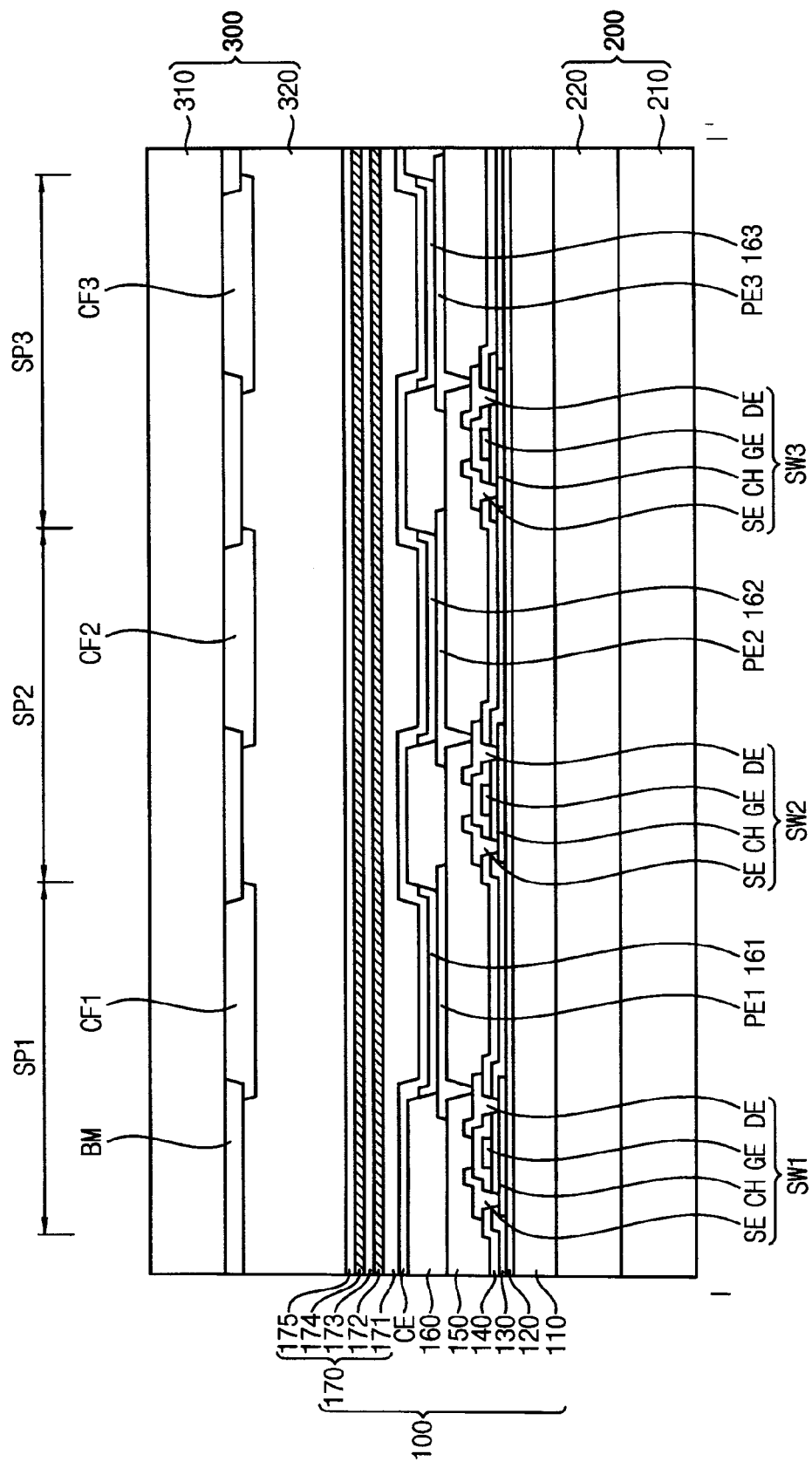
FIG. 2 is a cross-sectional view taken along a line I-I' of FIG. 1.

FIG. 1 is a plan view illustrating a display panel according to an exemplary embodiment of the present invention. FIG. 2 is a cross-sectional view taken along a line I-I' of FIG. 1.

Referring to FIGS. 1 and 2, the display panel includes a display substrate 100, an upper protecting film 300, and a lower protecting film 200. The display panel includes a plurality of unit pixels. One unit pixel, including a first sub-pixel SP1, a second sub-pixel SP2, and a third sub-pixel SP3, is described in the figures.

The display substrate 100 includes a base substrate 110, a buffer layer 120, a first insulation layer 130, a second insulation layer 140, first to third switching elements SW1, SW2, and SW3, a third insulation layer 150, first to third pixel electrodes PE1, PE2, and PE3, a pixel defining layer 160, first to third light emitting layers 161, 162, and 163, a common electrode CE, and a thin encapsulation film 170.

The base substrate 110 may include an insulation substrate. In addition, the base substrate 110 may include a flexible substrate. For example, the base substrate 110 may include a glass substrate, a quartz substrate, a transparent resin substrate, etc. Examples of the transparent resin substrate for the base substrate 110 may include polyimide-based resin, acryl-based resin, polyacrylate-based resin, polycarbonate-based resin, polyether-based resin, sulfonic acid containing resin, polyethylene terephthalate-based resin, etc.

The buffer layer 120 may be disposed on the base substrate 110. The buffer layer 120 may prevent diffusion of metal atoms and/or impurities from the base substrate 110. The buffer layer 120 may improve flatness of the surface of the base substrate 110. In addition, the buffer layer 120 may adjust the heat transfer rate of a successive crystallization process for a channel layer CH, to thereby obtaining a substantially uniform channel layer CH. The buffer layer 120 may be formed using a silicon compound. For example, the buffer layer 120 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), etc. These may be used alone or in a mixture thereof.

The channel layer CH is disposed on the buffer layer 120. The channel layer CH may include low temperature poly silicon (LTPS), which is formed by crystallizing amorphous silicon thin film using a laser annealing method. In addition, the channel layer CH may include a semiconductor layer of amorphous silicon (a-Si:H) and an ohmic contact layer of n+ amorphous silicon (n+a-Si:H). In addition, the channel layer CH may include an oxide semiconductor.

The first insulation layer 130 is disposed on the buffer layer 120 on which the channel layer CH is disposed. The first insulation layer 130 may include a silicon oxide, a metal oxide, etc.

The gate electrode GE is disposed on the first insulation layer 130 and overlaps the channel layer CH. The gate electrode GE is electrically connected to a gate line GL. The gate electrode may include a metal, an alloy, a conductive metal oxide, a transparent conductive material, etc.

The second insulation layer 140 is disposed on the first insulation layer 130 on which the gate electrode GE is disposed. The second insulation layer 140 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), etc. These may be used alone or in a mixture thereof. In addition, the second insulation layer 140 may have a single layer structure or a multi-layer structure. For example, the second insulation layer 140 may have a single-layered structure including a silicon oxide film, a silicon nitride film, a silicon oxynitride film, a silicon oxycarbide film, or a silicon carbon nitride film. Alternatively, the second insulation layer 140 may have a multilayered structure including at least two of a silicon oxide film, a silicon nitride film, a silicon oxynitride film, a silicon oxycarbide film, a silicon carbon nitride film, etc.

A first contact hole C1 is formed through the first and second insulation layers 130 and 140, so that the first contact hole C1 partially exposes the channel layer CH. A second contact hole C2 is formed through the first and second insulation layers 130 and 140, so that the second contact hole C2 partially exposes the channel layer CH.

A source electrode SE and a drain electrode DE are disposed on the second insulation layer 140. The source electrode SE is electrically connected to the channel layer CH through the first contact hole C1. The drain electrode DE is electrically connected to the channel layer CH through the second contact hole C2. The source electrode SE and the drain electrode DE may include a metal, an alloy, a conductive metal oxide, a transparent conductive material, etc.

The channel layer CH, the gate electrode GE, the source electrode SE and the drain electrode DE form the first switching element SW1. The first switching element SW1 is formed corresponding to the first sub-pixel SP1. Similarly, the second switching element SW2 is formed corresponding to the second sub-pixel SP2, and the third switching element SW3 is formed corresponding to the third sub-pixel SP3.

The third insulation layer 150 is disposed on the second insulation layer 140 on which the source and drain electrodes SE and DE are disposed. The third insulation layer 150 may be formed using an organic material. For example, the third insulation layer 150 may include a photoresist, an acryl-based resin, a polyimide-based resin, a polyamide-based resin, a siloxane-based resin, etc. These may be used alone or in a combination thereof. Alternatively, the third insulation layer 150 may include an inorganic material. For example, the third insulation layer 150 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These elements and compounds may be used alone or in a mixture thereof.

A third contact hole C3 is formed through the third insulation layer 150, so that the third contact hole C3 partially exposes the drain electrode DE.

The first to third pixel electrodes PE1, PE2, and PE3 are disposed on the third insulation layer 150. The first pixel electrode PE1 is electrically connected to the drain electrode DE of the first switching element SW1 through the third contact hole C3. The first pixel electrode PE1 is formed corresponding to the first sub-pixel SP1. Similarly, the second pixel electrode PE2 is formed corresponding to the second sub-pixel SP2 and is electrically connected to the second switching element SW2. The pixel electrode PE3 is formed corresponding to the third sub-pixel SP3 and is electrically connected to the third switching element SW3.

The first to third pixel electrodes PE1, PE2, and PE3 may include a reflective material. The first to third pixel electrodes PE1, PE2, and PE3 may have a reflectance of about 100%. For example, the first to third pixel electrodes PE1, PE2, and PE3 may include aluminum, an alloy containing aluminum, aluminum nitride, silver, an alloy containing silver, tungsten, tungsten nitride, copper, an alloy containing copper, nickel, an alloy containing nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc.

The pixel defining layer 160 is disposed on the third insulation layer 150 on which the first to third pixel electrodes PE1, PE2, and PE3 are disposed. Openings exposing the first to third pixel electrodes PE1, PE2, and PE3 may be formed through the pixel defining layer 160.

The pixel defining layer 160 may include an organic material or an inorganic material. For example, the pixel defining layer 160 may be formed using a photoresist, an acryl-based resin, a polyacryl-based resin, a polyimide-based resin, a silicon compound, etc.

The first to third light emitting layers 161, 162, and 163 are disposed on the first to third pixel electrodes PE1, PE2, and PE3, which are exposed through the openings of the pixel defining layer 160. In addition, the first to third light emitting layers 161, 162, and 163 may extend on a sidewall of the opening of the pixel defining layer 100. Each of the first to third light emitting layers 161, 162, and 163 may include light emitting material to generate colors different from each other. The first light emitting layer 161 is formed corresponding to the first sub-pixel SP1, and generates light having a first color. For example, the first light emitting layer 161 may generate red light. The second light emitting layer 162 is formed corresponding to the second sub-pixel SP2, and generates light having a second color different from the first color. For example, second light emitting layer 162 may generate green light. The third light emitting layer 163 is formed corresponding to the third sub-pixel SP3, and generates light having a third color different from the first and second colors. For example, the third light emitting layer 163 may generate blue light.

The common electrode CE is disposed on the pixel defining layer 160 on which the first to third light emitting layers 161, 162, and 163 are disposed. The common electrode CE may include a transmissive material or a reflective material in accordance with the emission type of the display device. For example, the common electrode CE may be formed using aluminum, an alloy containing aluminum, aluminum nitride, silver, an alloy containing silver, tungsten, tungsten nitride, copper, an alloy containing copper, nickel, an alloy containing nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof.

The thin encapsulation film 170 is disposed on the common electrode CE. The thin encapsulation film 170 protects the first to third light emitting layers 161, 162, and 163.

The thin encapsulation film 170 includes a plurality of organic and inorganic layers, which are alternately stacked. For example, the thin encapsulation film 170 may include a first organic layer 171, a first inorganic layer 172, a second organic layer 173, a second inorganic layer 174, and a third organic layer 175, which are sequentially stacked. The first, second, and third organic layers 171, 173, and 175 may include an acrylate-based material, and the first and second inorganic layer 172 and 174 may include an oxide-based material. The thin encapsulation film 170 may be formed using a low temperature process so as not to damage the first to third light emitting layers 161, 162, and 163. For example, the thin encapsulation film 170 may be formed by using a growth method at a low temperature, such as less than about 100° C. By virtue of the low-temperature growth method, the thin encapsulation film 170 may be grown and formed directly on the common electrode CE without damaging the first to third light emitting layers 161, 162, and 163. The thin encapsulation film 170 may have a thickness about 1 to 10 μm.

The lower protecting film 200 includes a first base layer 210 and a first pressure sensitive adhesive 220. The lower protecting film 200 protects the bottom of the display substrate 100.

The first base layer 210 may include glass, metal, or a polymer. When the first base layer 210 includes a polymer, the first base layer 210 may include polyimide, polycarbonate, polyethylene terephthalate (PET), polyurethane, polyacrynitril (PAN), polyethylene (PE), polypropylene (PP), etc. The first base layer 210 may have a thickness of about 75 μm.

The first pressure sensitive adhesive layer 220 is disposed between the first base layer 210 and the base substrate 110 of the display substrate 100. The first pressure sensitive adhesive layer 220 is used to attach the lower protecting film 200 onto the base substrate 110 of the display substrate 100. For example, the first pressure sensitive adhesive layer 220 may include acrylic polymer. The first pressure sensitive adhesive layer 220 may have a thickness of about 25 μm.

The upper protecting film 300 includes a second base layer 310, a black matrix BM, a first to third color filters CF1, CF2, and CF3, and a second pressure sensitive adhesive layer 320. The upper protecting film 300 protects the top of the display substrate 100.

The second base layer 310 may include glass, a metal, or a polymer. When the second base layer 310 includes a polymer, the first base layer 210 may include polyimide, polycarbonate, polyethyleneterephthalate (PET), polyurethane, polyacrynitril (PAN), polyethylene (PE), polypropylene (PP), and etc. The second base layer 310 may have a thickness of about 100 μm.

When the black matrix BM and the first to third color filters CF1, CF2, and CF3 are be formed on the second base layer 310, the heat-resistance temperature of the second base layer 310 may be higher than the manufacturing process temperature of the black matrix BM and the first to third color filters CF1, CF2, and CF3. For example, the heat-resistance temperature of the second base layer 310 may be about 200° C. to about 300° C.

The black matrix BM is disposed on the second base layer 310. The black matrix BM overlaps the data line DL, the gate line GL and the switching elements SW1, SW2, and SW3, and includes a light blocking material. The black matrix BM at least partially defines boundary of adjacent sub-pixels.

The first to third color filters CF1, CF2, and CF3 are disposed on the second base layer 310 on which the black matrix BM is disposed. The first to third color filters CF1, CF2, and CF3 are disposed corresponding to the first to third sub-pixel SP1, SP2, and SP3, respectively. In addition, the first to third color filters CF1, CF2, and CF3 are disposed corresponding to the first to third light emitting layer 161, 162, and 163. The first color filter CF1 has the same color as the first color of the light from the first light emitting layer 161. For example, when the first light emitting layer 161 generates red light, the first color filter CF1 may have a red color. The second color filter CF2 has the same color as the second color of the light from the second light emitting layer 162. For example, when the second light emitting layer 162 generates green light, the second color filter CF2 may have a green color. The third color filter CF3 has the same color as the third color of the light from the third light emitting layer 163. For example, when the third light emitting layer 163 generates a blue light, the third color filter CF3 may have a blue color.

The black matrix BM and the first to third color filters CF1, CF2, and CF3 may be formed by a traditional manufacturing process. For example, a manufacturing process of a black matrix and color filters for a liquid crystal display apparatus, including a pre-bake step and a post-bake step, may be used. The pre-bake step may occur at about 90 to 110° C. The post-bake step may occur at about 220 to 230° C.

The second pressure sensitive adhesive layer 320 is disposed on the black matrix BM and the first to third color filters CF1, CF2, and CF3. The second pressure sensitive adhesive layer 320 is used to attach the upper protecting film 300 onto the thin encapsulation film 170 of the display substrate 100. The second pressure sensitive adhesive layer 320 may perform an adhesive function. For example, the second pressure sensitive adhesive layer 320 may include an acrylic polymer. The second pressure sensitive adhesive layer 320 may have a thickness of about 100 μm (micrometer).

Figure 3:
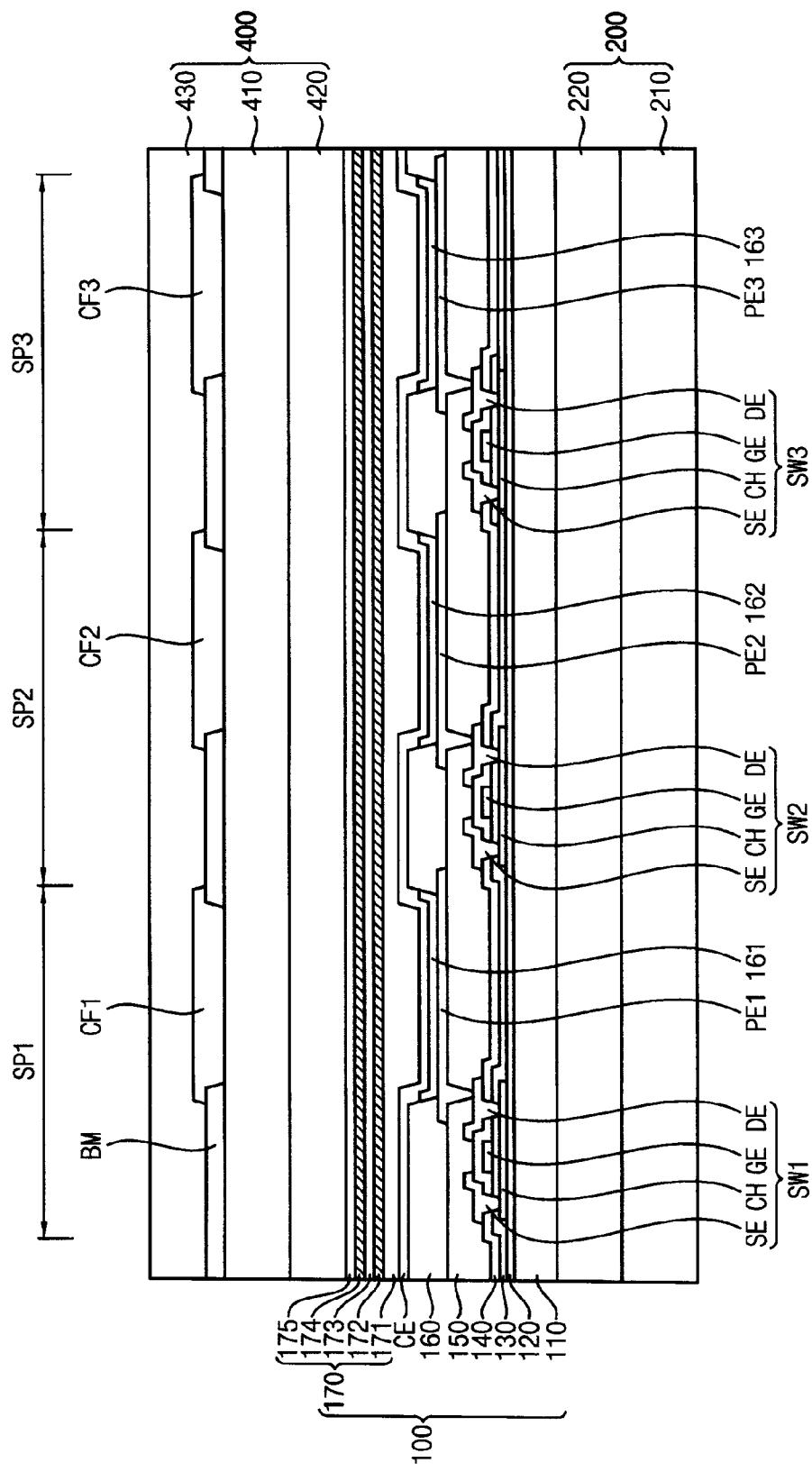
FIG. 3 is a plan view illustrating a display panel according to an exemplary embodiment of the present invention.

FIG. 3 is a plan view illustrating a display panel according to an exemplary embodiment of the invention.

Referring to FIG. 3, a display panel is substantially same as a display panel of FIG. 2 except for the presence of an upper protecting film 400. Thus, any further detailed descriptions concerning the same elements will be briefly explained or omitted.

The display panel includes a display substrate 100, the upper protecting film 400, and a lower protecting film 200. The display panel includes a plurality of unit pixels. A unit pixel includes a first sub-pixel SP1, a second sub-pixel SP2, and a third sub-pixel SP3.

The display substrate 100 includes a base substrate 110, a buffer layer 120, a first insulation layer 130, a second insulation layer 140, first to third switching elements SW1, SW2, and SW3, a third insulation layer 150, first to third pixel electrodes PE1, PE2, and PE3, a pixel defining layer 160, first to third light emitting layers 161, 162, and 163, a common electrode CE, and a thin encapsulation film 170. The lower protecting film 200 includes a first base layer 210 and a first pressure sensitive adhesive layer 220.

The upper protecting film 400 includes a second base layer 410, a black matrix BM, a first to third color filters CF1, CF2, and CF3, a second pressure sensitive adhesive layer 420, and an over-coating layer 430. The upper protecting film 400 protects the top of the display substrate 100.

The second base layer 410 may include glass, a metal, or a polymer. When the second base layer 410 includes a polymer, the first base layer 210 may include polyimide, polycarbonate, polyethyleneterephthalate (PET), polyurethane, polyacrynitril (PAN), polyethylene (PE), polypropylene (PP), etc. The second base layer 310 may have a thickness of about 100 μm.

When the black matrix BM and the first to third color filters CF1, CF2, and CF3 are formed on the second base layer 410, the heat-resistance temperature of the second base layer 410 may be higher than the manufacturing process temperature of the black matrix BM and the first to third color filters CF1, CF2, and CF3. For example, the heat-resistance temperature of the second base layer 410 may be about 200° C. to about 300° C.

The black matrix BM is disposed on the second base layer 410. The black matrix BM overlaps various wirings, such as a data line, a gate line, and switching elements, and includes a light blocking material. The black matrix BM defines a boundary of adjacent sub-pixels.

The first to third color filters CF1, CF2, and CF3 are disposed on the second base layer 410 on which the black matrix BM is disposed. The first to third color filters CF1, CF2, and CF3 are disposed corresponding to the first to third sub-pixel SP1, SP2, and SP3, respectively. In addition, the first to third color filters CF1, CF2, and CF3 are disposed corresponding to the first to third light emitting layers 161, 162, and 163, respectively. The first color filter CF1 has the same color as the first color of the light from the first light emitting layer. For example, when the first light emitting layer generates red light, the first color filter CF1 may have a red color. The second color filter CF2 has the same color as the second color of the light from the second light emitting layer. For example, when the second light emitting layer generates green light, the second color filter CF2 may have a green color. The third color filter CF3 has the same color as the third color of the light from the third light emitting layer. For example, when the third light emitting layer generates blue light, the third color filter CF3 may have a blue color.

The first to third color filters CF1, CF2, and CF3 have the same colors as the first to third colors of light from the first to third light emitting layers, respectively. Thus, external light passes through the display panel and is reflected on the first to third pixel electrodes PE1, PE2, and PE3, and then only a specific wavelength of the external light may pass through the color filters. Accordingly, the color filters may improve the display quality of the display panel by preventing the reflected external light from reducing the display quality.

The black matrix BM and the first to third color filters CF1, CF2, and CF3 may be formed by a traditional manufacturing process. For example, a manufacturing process of a black matrix and color filters for a liquid crystal display apparatus including a pre-bake step and a post-bake step may be used. The pre-bake step may occur at about 90 to 110° C. The post-bake step may occur at about 220 to 230° C.

The over-coating layer 430 is disposed on the first to third color filters CF1, CF2, and CF3 and the black matrix BM. The over-coating layer 430 planarizes the first to third color filters CF1, CF2, and CF3, protects the first to third color filters CF1, CF2, and CF3, and insulates the first to third color filters CF1, CF2, and CF3. The over-coating layer 430 may include an acrylic-epoxy material.

The second pressure sensitive adhesive layer 420 is disposed under the second base layer 410. Thus, the second pressure sensitive adhesive layer 420 is disposed on a side of second base layer 410 that is opposite the first to third color filters CF1, CF2, and CF3 and the black matrix BM. The second pressure sensitive adhesive layer 420 is used to attach the upper protecting film 400 onto the thin encapsulation film 170 of the display substrate 100. For example, the second pressure sensitive adhesive layer 420 may include an acrylic polymer. The second pressure sensitive adhesive layer 420 may have a thickness of about 100 μm.

Figure 4:
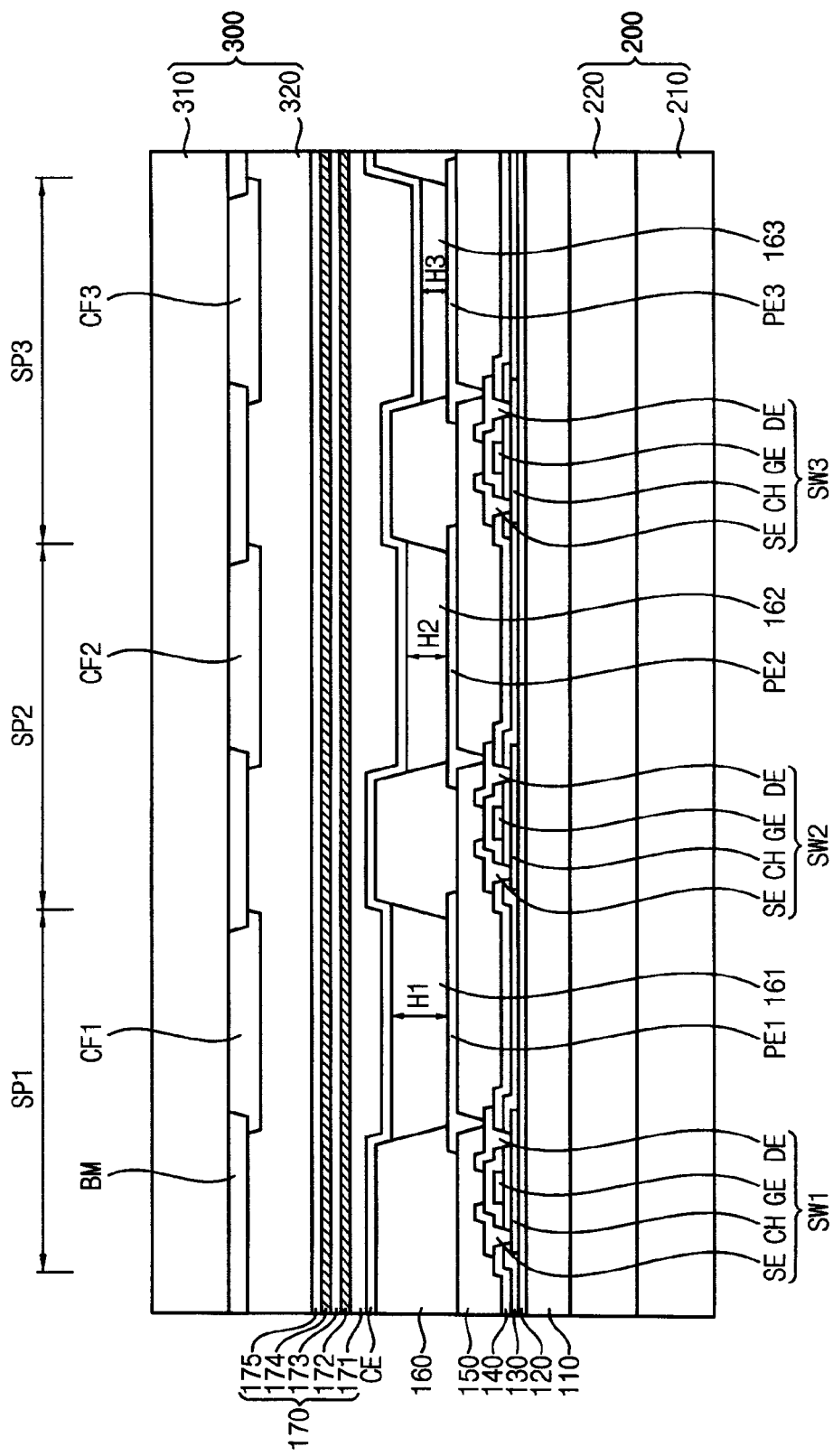
FIG. 4 is a plan view illustrating a display panel according to an exemplary embodiment of the present invention.

FIG. 4 is a plan view illustrating a display panel according to still an exemplary embodiment of the invention.

Referring to FIG. 4, a display panel is substantially the same as a display panel of FIG. 2, except for first to third light emitting layers 161, 162, and 163, and a pixel defining layer 160. Thus, any further detailed descriptions concerning the same elements will be briefly explained or omitted.

The display panel includes a display substrate 100, the upper protecting film 300 and a lower protecting film 200.

The display panel includes a plurality of unit pixels. A unit pixel includes a first sub-pixel SP1, a second sub-pixel SP2, and a third sub-pixel SP3.

The display substrate 100 includes a base substrate 110, a buffer layer 120, a first insulation layer 130, a second insulation layer 140, first to third switching elements SW1, SW2, and SW3, a third insulation layer 150, first to third pixel electrodes PE1, PE2, and PE3, a pixel defining layer 160, first to third light emitting layers 161, 162, and 163, a common electrode CE, and a thin encapsulation film 170.

The pixel defining layer 160 is disposed on the third insulation layer 150 on which the first to third pixel electrodes PE1, PE2, and PE3 are disposed. Openings exposing the first to third pixel electrodes PE1, PE2, and PE3 may be formed through the pixel defining layer 160. The pixel defining layer 160 may have different heights in each of sub-pixels according to the heights of the first to third light emitting layers 161, 162, and 163.

The pixel defining layer 160 may include an organic material or an inorganic material. For example, the pixel defining layer 160 may be formed using a photoresist, an acryl-based resin, a polyacryl-based resin, a polyimide-based resin, a silicon compound, etc.

The first to third light emitting layers 161, 162, and 163 are disposed on the first to third pixel electrodes PE1, PE2, and PE3, which are exposed through the openings of the pixel defining layer 160. In addition, the first to third light emitting layers 161, 162, and 163 may extend on a sidewall of the opening of the pixel defining layer 100. Each of the first to third light emitting layers 161, 162, and 163 may include a light emitting material to generate different colors. The first light emitting layer 161 is formed corresponding to the first sub-pixel SP1, and generates light having a first color. For example, the first light emitting layer 161 may generate red light. The second light emitting layer 162 is formed corresponding to the second sub-pixel SP2, and generates light having a second color different from the first color. For example, second light emitting layer 162 may generate green light. The third light emitting layer 163 is formed corresponding to the third sub-pixel SP3, and generates light having a third color different from the first and second colors. For example, the third light emitting layer 163 may generate blue light.

The first to third light emitting layers 161, 162, and 163 may have different heights. Each of the first to third light emitting layers 161, 162, and 163 has a height that induces destructive interference to reduce reflectance of external light on the first to third pixel electrodes PE1, PE2, and PE3, and on the common electrode CE. The heights of the first to third light emitting layers 161, 162, and 163 are dependent upon color wavelengths and reflective indexes of the first to third light emitting layers 161, 162, and 163.

For example, the first light emitting layer 161 may emit red light, the second light emitting layer 162 may emit green light, and the third light emitting layer 163 may emit blue light. In this case, a portion of the external light reflected on the common electrode CE and another portion of the external light passes through the common electrode CE because of the semi-transparent property of the common electrode CE. In the case of red light, the portion of the external light, which passes through the common electrode CE, passes through the first light emitting layer 161 is then reflected by the first pixel electrode PE1, and then passes through the first light emitting layer 161 and the common electrode CE. Accordingly, red light of the external light which is reflected by the first pixel electrode PE1 and red light of the external light which passes through the common electrode CE and reflected by the first pixel electrode PE1 destructively interfere, so that reflectance of red light from external light may be decreased.

When a height of the first light emitting layer 161 (H1) satisfies the following condition:

$$2n_R(H1)=m\lambda_R \text{ or } 2n_R(H1)=(m+1/2)\lambda_R,$$

where $n_R$ and $\lambda_R$ are a refractive index of the first light emitting layer 161, and a wavelength of red light which is incident into, respectively, and m is an integer, then red light, which is reflected on the common electrode CE, and red light which passes through the common electrode CE and reflected on the first pixel electrode PE1, may destructively interfere with each other. Thus, reflectance of red light from the external light may be decreased.

Similarly, when a height of the second light emitting layer 162 (H2) satisfies the following condition:

$$2n_G(H2)=m\lambda_G \text{ or } 2n_G(H2)=(m+1/2)\lambda_G,$$

where $n_G$ and $\lambda_G$ are a refractive index of the second light emitting layer 162, and a wavelength of green light which is incident into, respectively, and m is an integer, then green light, which is reflected on the common electrode CE, and green light which passes through the common electrode CE and reflected by the first pixel electrode PE1, may destructively interfere with each other. Thus, reflectance of green light from the external light may be decreased.

In addition, when a height of the third light emitting layer 163 (H3) satisfies the following condition:

$$2n_B(H3)=m\lambda_B \text{ or } 2n_B(H3)=(m+1/2)\lambda_B,$$

where $n_B$ and $\lambda_B$ are a refractive index of the third light emitting layer 163, and a wavelength of blue light which is incident into, respectively, and m is an integer, then blue light, which is reflected on the common electrode CE, and blue light which passes through the common electrode CE and reflected on the first pixel electrode PE1, may destructively interfere with each other. Thus, reflectance of blue light from the external light may be decreased.

Figure 5A:
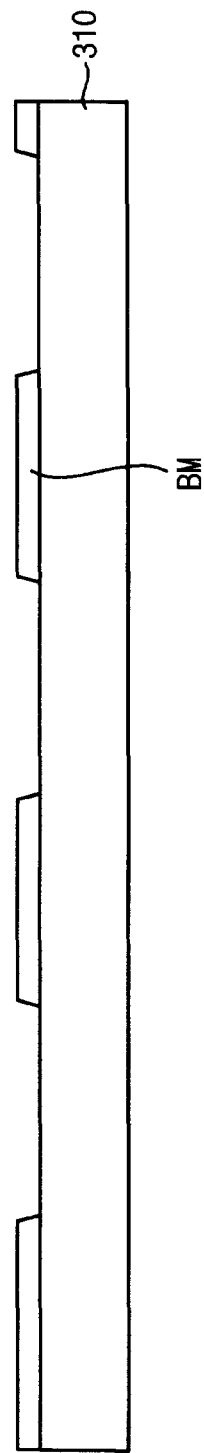
FIGS. 5A to 5C are cross-sectional views illustrating a method of manufacturing an upper protecting film of the display panel of FIG. 2.
Figure 5B:
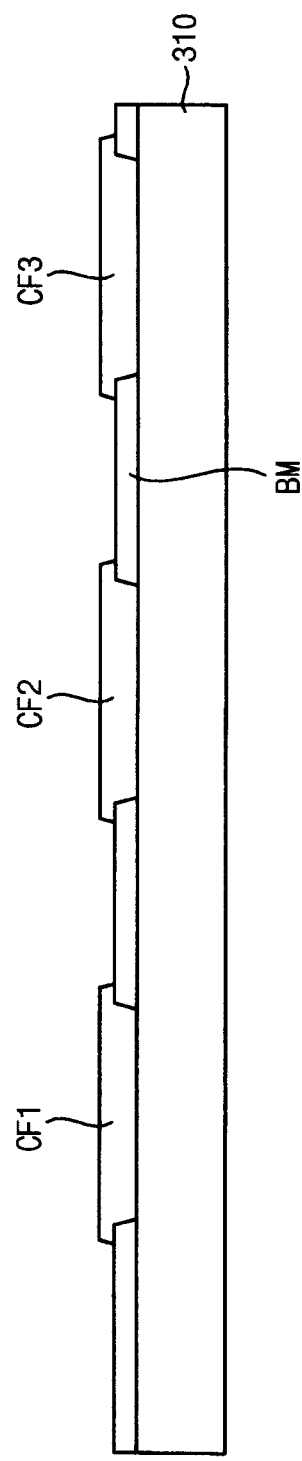
Figure 5C:
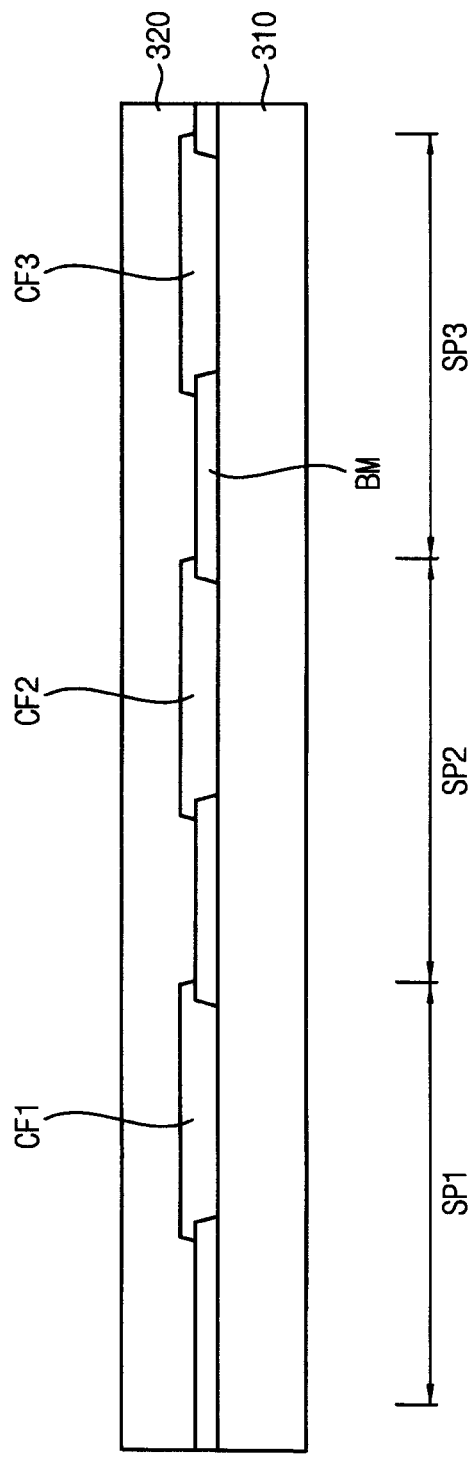

FIGS. 5A to 5C are cross-sectional views illustrating a method of manufacturing an upper protecting film 300 of the display panel of FIG. 2. The method of manufacturing the upper protecting film 300 includes forming a black matrix BM, forming first to third color filters CF1, CF2, and CF3, and forming a second pressure sensitive adhesive layer 320.

Referring to FIG. 5A, in forming the black matrix BM, a black matrix BM is formed on a second base layer 310. A light blocking material is formed on the second base layer 310 by a sputtering method. The light blocking material is then exposed using a patterned mask, and then the light blocking material is developed to form the black matrix BM. The second base layer 310 may include glass, a metal, or a polymer. When the second base layer 310 includes the polymer, the first base layer 210 may include polyimide, polycarbonate, polyethyleneterephthalate (PET), polyurethane, polyacrynitril (PAN), polyethylene (PE), polypropylene (PP), and etc. The second base layer 310 may have a thickness of about 100 μm. The light blocking material may include a metal such as chromium (Cr), a carbon based organic material, etc.

Referring to FIGS. 5A-5C, in forming the first to third color filters CF1, CF2, and CF3, first to third color filters CF1, CF2, and CF3 are formed on the second base layer 310 on which the black matrix BM is formed. The first to third color filters CF1, CF2, and CF3 may be formed corresponding to the first to third sub-pixels SP1 to SP3, respectively. Each of the color filters CF1, CF2, and CF3 may be formed to overlap an adjacent color filter on the black matrix BM. The first to third color filters CF1, CF2, and CF3 may be sequentially formed.

Forming the first color filter CF1 may include forming a first color resist on the second base layer 310 on which the black matrix BM is formed, exposing the first color resist using a patterned mask, and developing the first color resist to form the first color filter CF1.

In this case, before exposing the first color resist, forming the first color filter CF1 may further include a vacuum drying process and/or a pre-bake process. In the pre-bake process, the first color resist may be thermally hardened at about 90 to 110° C. In addition, after developing the first color resist, forming the first color filter CF1 may further include a post-bake process. In the post-bake process, the first color filter CF1 may be thermally hardened at about 220 to 230° C.

Forming the second color filter CF2 may include forming a second color resist on the second base layer 310 on which the first color filter CF1 is formed, exposing the second color resist using a patterned mask, and developing the second color resist to form the second color filter CF2.

In this case, before exposing the second color resist, forming the second color filter CF2 may further include a vacuum drying process and/or a pre-bake process. In the pre-bake process, the second color resist may be thermally hardened at about 90 to 110° C. In addition, after developing the second color resist, forming the second color filter CF2 may further include a post-bake process. In the post-bake process, the second color filter CF2 may be thermally hardened at about 220 to 230° C.

Forming the third color filter CF3 may include forming a third color resist on the second base layer 310 on which the first and second color filters CF1 and CF2 are formed, exposing the third color resist using a patterned mask, and developing the third color resist to form the third color filter CF3.

In this case, before exposing the third color resist, forming the third color filter CF3 may further include a vacuum drying process and/or a pre-bake process. In the pre-bake process, the third color resist may be thermally hardened at about 90 to 110° C. In addition, after developing the third color resist, forming the third color filter CF2 may further include a post-bake process. In the post-bake process, the third color filter CF2 may be thermally hardened at about 220 to 230° C. In addition, the first to third color filters CF1, CF2, and CF3 may be formed by an inkjet method.

Referring to FIG. 5C, in forming the second pressure sensitive adhesive layer 320, a second pressure sensitive adhesive layer 320 is formed on the black matrix BM and the first to third color filters CF1, CF2, and CF3. The second pressure sensitive adhesive layer 320 may be formed by attaching an additional adhesive tape on the black matrix BM and the first to third color filters CF1, CF2, and CF3. For example, the second pressure sensitive adhesive layer 320 may be a tape including acrylic polymer. The second pressure sensitive adhesive layer 320 may have a thickness of about 100 μm.

Figure 6A:
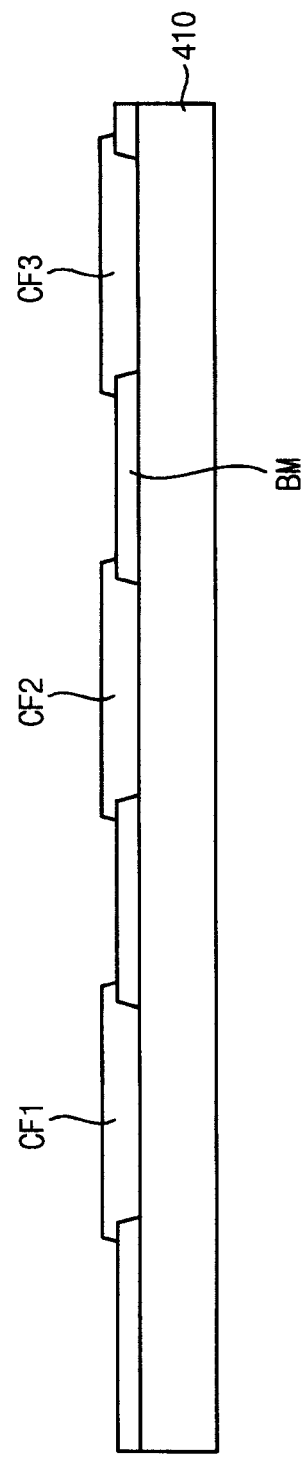
FIGS. 6A to 6C are cross-sectional views illustrating a method of manufacturing an upper protecting film of the display panel of FIG. 3.
Figure 6B:
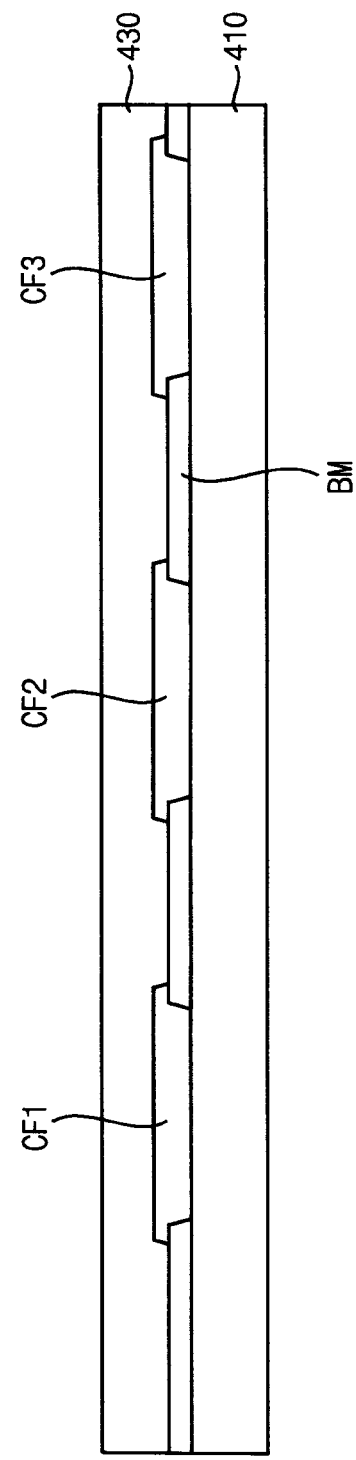
Figure 6C:
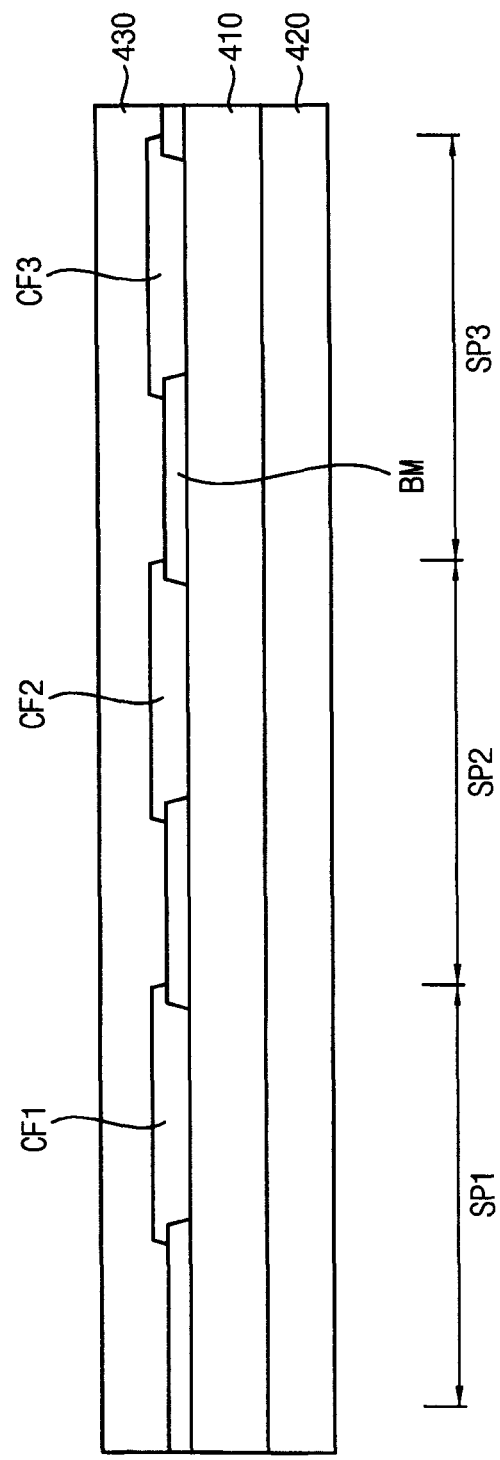

FIGS. 6A to 6C are cross-sectional views illustrating a method of manufacturing an upper protecting film 400 of the display panel of FIG. 3. The method of manufacturing the upper protecting film 400 is substantially same as a method of manufacturing the upper protecting film 300 of FIGS. 5A to 5C, except for forming an over-coating layer 430 and forming a second pressure sensitive adhesive 420. Thus, any further detailed descriptions concerning the same elements will be briefly explained or omitted.

The method of manufacturing the upper protecting film includes forming a black matrix BM, forming first to third color filters CF1, CF2, and CF3, forming an over-coating layer 430, and forming a second pressure sensitive adhesive layer 420.

Referring to FIG. 6A, in forming the black matrix BM, a black matrix BM is formed on a second bases layer 410. A light blocking material is formed on the second base layer 310 by a sputtering method, the light blocking material is exposed using a patterned mask, and then the light blocking material is developed to form the black matrix BM.

Referring again to FIG. 6A, in forming the first to third color filters CF1, CF2, and CF3, first to third color filters CF1, CF2, and CF3 are formed on the second base layer 410 on which the black matrix BM is formed. The first to third color filters CF1, CF2, and CF3 may be formed corresponding to the first to third sub-pixel (refers to SP1 to SP3 of FIG. 5C), respectively. The color filters CF1, CF2, and CF3 may be formed such that each color filter is overlapped on the black matrix BM. The first to third color filters CF1, CF2, and CF3 may be sequentially formed.

Forming the first color filter CF1 may include forming a first color resist on the second base layer 410 on which the black matrix BM is formed, exposing the first color resist using a patterned mask, and developing the first color resist.

In this case, before exposing the first color resist, forming the first color filter CF1 may further include a vacuum drying process and/or a pre-bake process. In the pre-bake process, the first color resist may be thermally hardened at about 90 to 110° C. In addition, after developing the first color resist, forming the first color filter CF1 may further include a post-bake process. In the post-bake process, the first color filter CF1 may be thermally hardened at about 220 to 230° C.

Forming the second color filter CF2 may include forming a second color resist on the second base layer 410 on which the first color filter CF1 is formed, exposing the second color resist using a patterned mask, and developing the second color resist to form the second color filter CF2.

In this case, before exposing the second color resist, forming the second color filter CF2 may further include a vacuum drying process and/or a pre-bake process. In the pre-bake process, the second color resist may be thermally hardened at about 90 to 110° C. In addition, after developing the second color resist, forming the second color filter CF2 may further include a post-bake process. In the post-bake process, the second color filter CF2 may be thermally hardened at about 220 to 230° C.

Forming the third color filter CF3 may include forming a third color resist on the second base layer 410 on which the first and second color filters CF1 and CF2 are formed, exposing the third color resist using a patterned mask, and developing the third color resist to form the third color filter CF3.

In this case, before exposing the third color resist, forming the third color filter CF3 may further include a vacuum drying process and/or a pre-bake process. In the pre-bake process, the third color resist may be thermally hardened at about 90 to 110° C. In addition, after developing the third color resist, forming the third color filter CF2 may further include a post-bake process. In the post-bake process, the third color filter CF2 may be thermally hardened at about 220 to 230° C.

In addition, the first to third color filters CF1, CF2, and CF3 may be formed by an inkjet method.

Referring to FIG. 6B, in forming the over-coating layer 430, an over-coating layer 430 is formed on the black matrix BM and the first to third color filters CF1, CF2, and CF3. The over-coating layer 430 planarizes the first to third color filters CF1, CF2, and CF3, protects the first to third color filters CF1, CF2, and CF3, and insulates the first to third color filters CF1, CF2, and CF3. The over-coating layer 430 may be formed of an acrylic-epoxy material.

Referring to FIG. 6C, a second pressure sensitive adhesive layer 420 is formed under the over-coating layer 430. Thus, the second pressure sensitive adhesive layer 420 is formed on a side of the second base layer 410 opposite the first to third color filters CF1, CF2, and CF3 and the black matrix BM. The second pressure sensitive adhesive layer 420 may be formed by attaching an additional adhesive tape onto the over-coating layer 430. For example, the second pressure sensitive adhesive layer 420 may be a tape including an acrylic polymer. The second pressure sensitive adhesive layer 420 may have a thickness of about 100 µm (micrometer).

FIGS. 7A to 7G are cross-sectional views illustrating a method of manufacturing a display substrate of the display panel of FIG. 2, in which one sub-pixel is described.

Figure 7A:
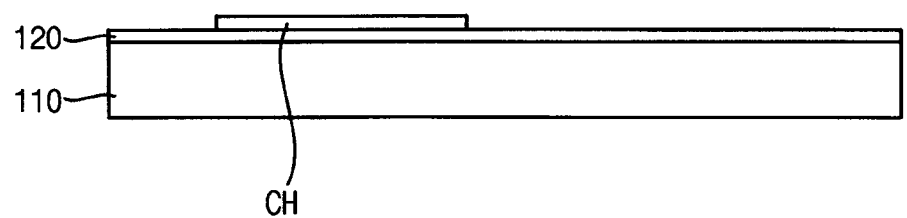
FIGS. 7A to 7G are cross-sectional views illustrating a method of manufacturing a display substrate of the display panel of FIG. 2.

Referring to FIG. 7A, a buffer layer 120 is formed on a base substrate 110. The buffer layer 120 may be formed by a spin coating process, a chemical vapor deposition (CVD) process, a plasma enhanced chemical vapor deposition (PECVD) process, a high density plasma-chemical vapor deposition (HDP-CVD) process, a printing process, etc.

A channel layer CH is formed on the buffer layer 120. A semiconductor layer may be formed on the buffer layer 55, and then the channel layer CH is formed by patterning the semiconductor layer. The channel layer CH may be formed by a CVD process, a PECVD process, a low pressure chemical vapor deposition (LPCVD) process, a sputtering process, etc. In addition, the channel layer CH may include low temperature poly silicon (LTPS).

Figure 7B:
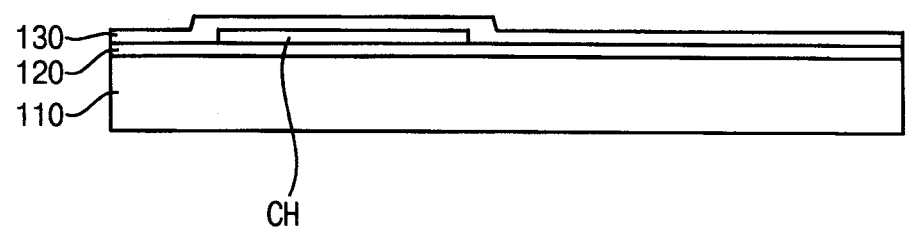

Referring to FIG. 7B, a first insulation layer 130 is formed on the buffer layer 120 on which the channel layer CH is formed. The first insulation layer 130 may be formed by a spin coating process, a printing process, a sputtering process, a CVD process, an ALD process, a PECVD process, an HDP-CVD process, or a vacuum evaporation process in accordance with ingredients included in the first insulation layer 130.

Figure 7C:
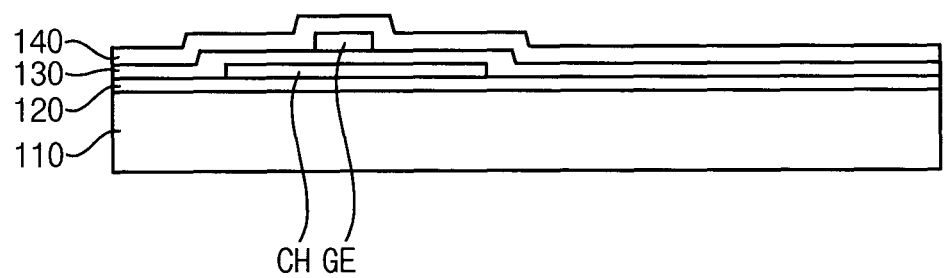

Referring to FIG. 7C, a gate electrode GE overlapping the channel layer CH is formed on the first insulation layer 130. A conductive layer is formed on the first insulation layer 130, and then the conductive layer may be partially etched by a photolithography process or an etching process using an additional etching mask. Hence, the gate electrode GE is formed.

A second insulation layer 140 is formed on the first insulation layer 130 on which the gate electrode GE is formed. The second insulation layer 140 may be formed by a spin coating process, a printing process, a sputtering process, a CVD process, an ALD process, a PECVD process, an HDP-CVD process, or a vacuum evaporation process in accordance with ingredients included in the second insulation layer 140.

Figure 7D:
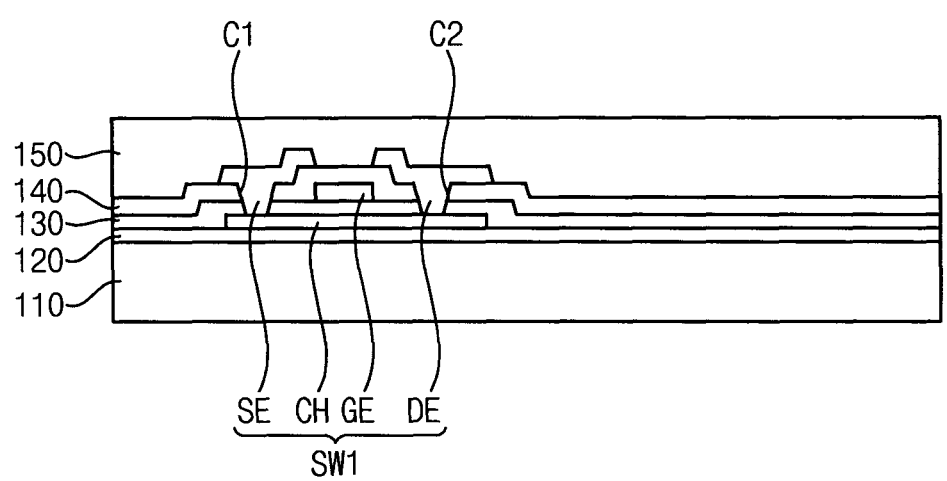

Referring to FIG. 7D, first and second contact holes C1, C2, exposing the channel layer CH, are formed through the first and second insulation layers 130 and 140. The first and second contact holes C1, C2 may be formed by a photolithography process or an etching process using an additional etching mask.

A source electrode SE and a drain electrode DE are formed on the second insulation layer 140 through which the first and second contact holes. The source electrode SE is electrically connected to the channel layer CH through the first contact hole. The drain electrode DE is electrically connected to the channel layer CH through the second contact hole. A conductive layer is formed on the second insulation layer 140, and then the conductive layer may be partially etched by a photolithography process or an etching process using an additional etching mask. Hence, the source electrode SE and the drain electrode DE are formed.

The third insulation layer 150 is formed on the second insulation layer 140 on which the source and drain electrodes SE and DE are disposed. The third insulation layer 150 may be formed by a spin coating process, a printing process, a sputtering process, a CVD process, an ALD process, a PECVD process, an HDP-CVD process, or a vacuum evaporation process in accordance with ingredients included in the third insulation layer 150.

Figure 7E:
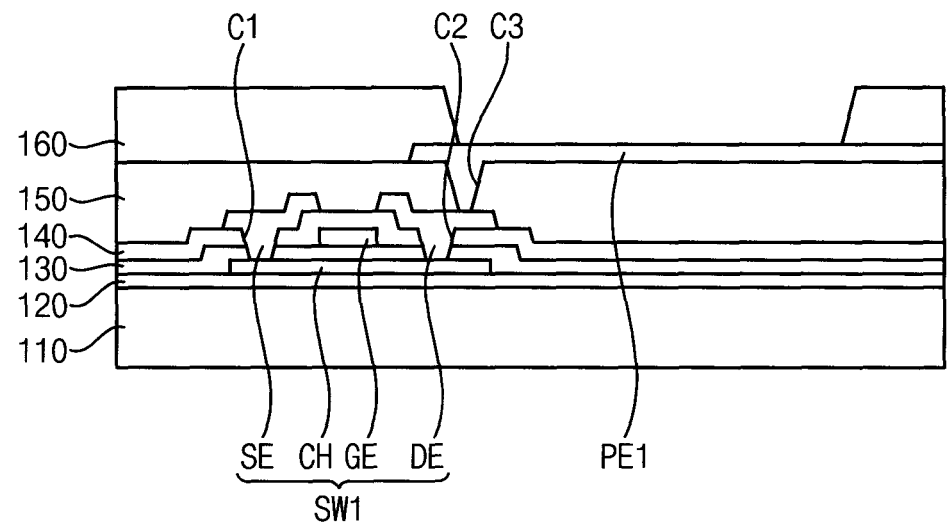

Referring to FIG. 7E, a third contact hole C3 is formed through the third insulation layer 150, so that the third contact hole C3 partially exposes the drain electrode DE. The third contact hole C3 may be formed by a photolithography process or an etching process using an additional etching mask.

A first pixel electrode PE1 is formed on the third insulation layer 150 through which the third contact hole C3 is formed. The first pixel electrode PE1 is electrically connected to the drain electrode DE of the first switching element SW1 through the third contact hole C3. The first pixel electrode PE1 may be formed by a printing process, a sputtering process, a CVD process, a pulsed laser deposition (PLD) process, a vacuum evaporation process, an atomic layer deposition (ALD) process, etc.

A pixel defining layer 160 is disposed on the third insulation layer 150 on which the first pixel electrode PE1 is formed. The pixel defining layer 160 may be obtained by a spin coating process, a spray process, a printing process, a CVD process, a PECVD process, an HDP-CVD process, etc.

Figure 7F:
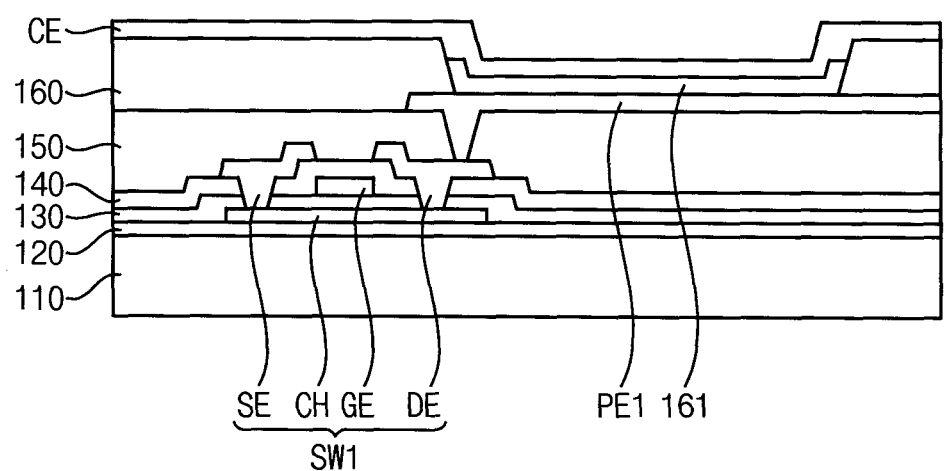

Referring to FIG. 7F, a light emitting layer 161 is formed on the first pixel electrode PE1, which is exposed through an opening of the pixel defining layer 160. The first light emitting layer 161 may be formed by a laser induced thermal imaging process, a printing process, etc.

A common electrode CE is formed on the pixel defining layer 160 and the first pixel electrode PE1. The common electrode CE may be formed by a printing process, a sputtering process, a CVD process, a PLD process, a vacuum evaporation process, an ALD process, etc.

Figure 7G:
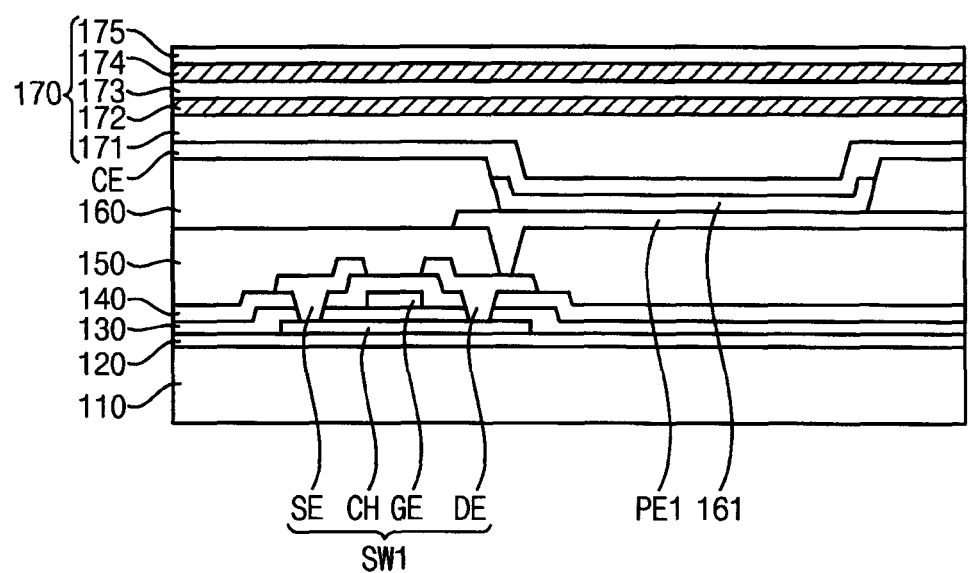

Referring to FIG. 7G, a thin encapsulation film 170 is formed on the common electrode CE. The thin encapsulation film 170 is formed by alternately stacking a plurality of organic and inorganic layers. The thin encapsulation film 170 may be formed using a growth method at a low temperature, such as about 100° C. or less. By virtue of the low-temperature growth method, the thin encapsulation film 170 may be grown and formed directly on the common electrode CE without damaging the first light emitting layer 161. For example, the thin encapsulation film 170 may include a first organic layer 171, a first inorganic layer 172, a second organic layer 173, a second inorganic layer 174, and a third organic layer 175, which are sequentially stacked. The first organic layer 171 is formed on the common electrode CE, and then the first inorganic layer 172 is formed on the first organic layer 171. The second organic layer 173 is formed on the first inorganic layer 172, and then the second inorganic layer 174 is formed on second organic layer 173. The third organic layer 175 is formed on the second inorganic layer 174.

FIG. 8 is a cross-sectional view illustrating a step of attaching an upper protecting film and a lower protecting film to a display substrate for manufacturing a display panel.

After completion of the display substrate 100, an upper protecting film 300 and a lower protecting film 200 may be formed by an additional process. Then, a first pressure sensitive adhesive layer 220 of the lower protecting film 200 is attached onto the base substrate 110 of the display substrate 100 by pressing the lower protecting film 200, and a second pressure sensitive adhesive layer 320 of the upper protecting film 200 is attached onto the thin encapsulation film 170 of the display substrate 100, thereby completing the display panel.

According to the present invention, a display panel includes a color filter having the same color as a color of light from a light emitting layer, so that reflectance of external light on a pixel electrode is reduced. Thus, a display quality of the display panel may be improved.

In addition, a protecting film including the color filter is attached on a display substrate including the light emitting layer using a pressure sensitive adhesive layer, so that damage to the light emitting layer caused by heat may be prevented, even though the color filter is formed by a relatively high temperature process.

In addition, when the display panel is a flexible display, the color filter may replace a traditional polarizer for reducing reflectance, so that thickness of the display panel may be decreased. Thus, flexibility of the display panel may be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display panel comprising:
   a first switching element;
   a first pixel electrode electrically connected to the first switching element, the first pixel electrode comprising a reflective material;
   a first light emitting layer disposed on the first pixel electrode, the first light emitting layer configured to emit light having a first color when a voltage is applied to the first pixel electrode;
   an encapsulation film disposed on the first light emitting layer and configured to protect the first light emitting layer;
   a pressure sensitive adhesive layer disposed on the encapsulation film; and
   a first color filter disposed on the pressure sensitive adhesive layer, facing the first light emitting layer, and comprising the first color.

2. The display panel of claim 1, further comprising a base layer disposed on the first color filter, and the base layer comprising glass, a metal, or a polymer.

3. The display panel of claim 2, wherein the base layer comprises the polymer and any one of a polyimide, a polycarbonate, a polyethylene terephthalate (PET), a polyurethane, a polyacrynitril (PAN), a polyethylene (PE) and a polypropylene (PP).

4. The display panel of claim 1, wherein the encapsulation film comprises organic layers and inorganic layers which are alternately stacked.

5. The display panel of claim 4, wherein:
   the organic layers of the encapsulation film comprise an acrylate-based material, and the inorganic layers of the encapsulation film comprise an oxide-based material; and
   the encapsulation film is formed at a temperature less than 100° C.

6. The display panel of claim 1, wherein the first electrode has a reflectance of about 100%.

7. The display panel of claim 1, wherein the first switching element comprises a low temperature poly silicon which is formed by crystallizing amorphous silicon thin film using laser annealing.

8. The display panel of claim 7, wherein the low temperature poly silicon is formed at a temperature less than 100° C.

9. The display panel of claim 1, further comprising:
   a second switching element;
   a second pixel electrode electrically connected to the second switching element, the second pixel electrode comprising a reflective material;
   a second light emitting layer disposed on the second pixel electrode, the second light emitting layer configured to emit light having a second color different from the first color when a voltage is applied to the second pixel electrode;
   a third switching element;
   a third pixel electrode electrically connected to the third switching element, the third pixel electrode comprising a reflective material;
   a third light emitting layer disposed on the third pixel electrode, the third light emitting layer configured to emit light having a third color different from the first and second colors when a voltage is applied to the third pixel electrode;
   a second color filter disposed on the pressure sensitive adhesive layer, the second color filter facing the second light emitting layer, and having the second color; and
   a third color filter disposed on the pressure sensitive adhesive layer, the third color filter facing the third light emitting layer, and having the third color.

10. The display panel of claim 9, further comprising:
    a base layer; and
    a black matrix disposed on the base layer, and separating the first to third color filters.

11. The display panel of claim 10, further comprising an upper protecting film disposed on the base substrate.

12. The display panel of claim 1, wherein the pressure sensitive adhesive layer comprises an acrylic polymer.

* * * * *